(12) United States Patent
Nguyen (10) Patent No.: US 6,565,661 B1
(45) Date of Patent: May 20, 2003

(54) HIGH FLOW CONDUCTANCE AND HIGH THERMAL CONDUCTANCE SHOWERHEAD SYSTEM AND METHOD

(75) Inventor: Tue Nguyen, Vancouver, WA (US)

(73) Assignee: Simplus Systems Corporation, Fremont, CA (US)

( * ) Notice: Subject to any disclaimer, the term of this patent is extended or adjusted under 35 U.S.C. 154(b) by 86 days.

(21) Appl. No.: 09/325,835

(22) Filed: Jun. 4, 1999

(51) Int. Cl.$^7$ ............................................... C23C 16/00
(52) U.S. Cl. ....................................................... 118/715
(58) Field of Search .......................................... 118/715

(56) References Cited

U.S. PATENT DOCUMENTS

| | | | | |
|---|---|---|---|---|
| 4,590,042 A | * | 5/1986 | Drage .................... | 118/723 VE |
| 4,792,378 A | * | 12/1988 | Rose et al. ................. | 438/706 |
| 5,268,034 A | * | 12/1993 | Vukelic ...................... | 118/719 |
| 5,464,499 A | | 11/1995 | Moslehi et al. | |
| 5,624,498 A | * | 4/1997 | Lee et al. .................... | 118/715 |
| 5,728,223 A | * | 3/1998 | Murakami et al. .......... | 118/715 |

FOREIGN PATENT DOCUMENTS

JP 57-37821 * 3/1982

* cited by examiner

Primary Examiner—Gregory Mills
Assistant Examiner—Sylvia R. MacArthur
(74) Attorney, Agent, or Firm—Tue Nguyen (57) ABSTRACT

A vapor supply apparatus, for use in a semiconductor device manufacturing process, provides high flow conductance and high thermal conductance showerhead plate for supplying various precursors to a reaction chamber. The high flow conductance and high thermal conductance showerhead plate comprises a thick plate for high thermal conductance and variable size delivery hole for high flow conductance. A variation of the high flow conductance and high thermal conductance showerhead plate having the delivery holes tilted outward can be used as a baffle to diffuse the precursor to a large area. A showerhead system using high flow conductance and high thermal conductance showerhead plates is well suitable for delivering liquid precursors.

11 Claims, 8 Drawing Sheets

HIGH FLOW CONDUCTANCE AND HIGH THERMAL CONDUCTANCE SHOWERHEAD SYSTEM AND METHOD

FIELD OF THE INVENTION

This invention relates to an apparatus for use in the integrated circuit (IC) fabrication processes and, more particularly to a high flow conductance and high thermal conductance showerhead and method to deliver precursor to a substrate.

BACKGROUND OF THE INVENTION

Two of the most fundamental processes in IC fabrication are chemical vapor deposition (CVD) and etching. CVD processes use vapor precursors for the deposition of thin films on an IC substrate, while etching processes use vapor precursors for the etching of thin films on an IC substrate. The basic differences between CVD and etching processes are the precursors used and the process conditions applied, since the reaction systems used in both processes are similar. Basically, the reactor used for both processes consists of a reactor chamber, a precursor delivery system, a susceptor to hold the IC substrate and an energy source to decompose the precursor vapor to a reactive species to allow a thin film to form on the IC substrate (CVD process) or to etch an existing thin film on the IC substrate (etch process). Effective power sources are heat (in the case of thermal reactors) and plasma energy (in the case of plasma reactors) such as radio frequency (RF) power, microwave energy (MW) power, low frequency (10 KHz–1 MHz) power, optical energy (e.g. a laser or ultraviolet light) to decompose the introduced precursors. Also, the IC substrate could be biased or heated (100° C.–1200° C.) through the susceptor, often in the case of CVD processes, to promote the reaction of the decomposed atoms or molecules and to control the physical properties of the formed films.

The basic function of the susceptor is to hold the IC substrate, such as a wafer. The simplest susceptor consists of 3 pins to hold the wafer. Another possible function of the susceptor is to transfer thermal energy to the wafer using an embedded heater. It is not desirable to transfer thermal energy to any other surfaces but the wafer, therefore the susceptor often employs elaborate means to insulate other surfaces and possible cooling means to reduce the thermal energy unavoidably leaking to these surfaces. The heated susceptor has been a separate entity in the reactor system.

The precursor delivery system often consists of a showerhead-type disperser for the introduction of precursor vapor into the reactor. The showerhead could incorporated a heat transfer structure whereby the temperature of the precursors is controllably maintained at the desired temperature level for efficient operation. Precursors are the chemical compounds that could be brought together in a reactor chamber. The reactive precursors either decompose or react with each other under a catalyst or an energy source. Non-reactive precursors such as helium, nitrogen, argon sometimes are used to dilute the reactive precursors or to provide a curtain wall. The precursors should be in the gaseous state before reaching the IC substrate to ensure uniform coating (CVD) or uniform etching (etching system), and to allow efficient molecular interaction. Outside the reaction chamber, the precursors could be in gaseous, liquid or solid state. Gaseous state precursors are the simplest form in IC processing since no extra work will be involve in the delivery of the precursors to the substrate. Liquid precursors require a vaporizer to convert to the gaseous state before exiting the showerhead. Solid precursors also need to be converted into the gaseous state. A vaporizer is normally a heated plate where the thermal energy supplied can vaporize the liquid precursor at the inlet and release vapor precursor at the outlet.

Figure 1:
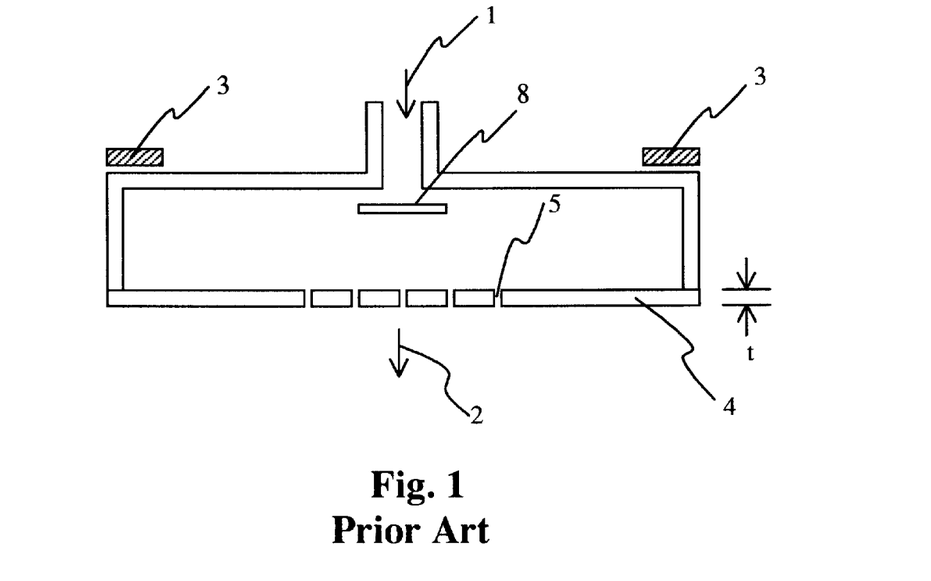
FIG. 1 is a schematic of a prior art showerhead.

FIG. 1 is a prior art schematic diagram showing a typical showerhead. The showerhead consists of the body structure, enclosing an interior volume. The principle component of the showerhead is the showerhead plate 4, having thickness t and delivery holes 5. The precursor enters through the inlet port 1, disperses in the interior volume, and exits through the outlet ports 2 to a wafer sitting on top of the substrate. The baffle 8 is used to disperse the inlet precursor for a more uniform delivery. The heater 3 is used to maintain the showerhead at the desired temperature. The basic structure of the showerhead is the thin thickness t of the showerhead plate, typically less than 2 mm. The thickness t is thin to have a high flow conductance across the showerhead plate 4. The drawback of the thin showerhead plate is the low thermal conductance from the heater 3. The baffle also has very low thermal conductance due to high contact resistance. For gaseous precursors such as $SiH_4$, $NH_3$, the low thermal conductance poses little any difficulty during the operation of the showerhead. However, for liquid precursors, low thermal conductance is not desirable because the precursor, or its by-products, could condense at regions of low temperature. Furthermore, liquid precursors require much more energy to convert to gaseous state, therefore low thermal conductance showerhead plate is not quite suitable for liquid precursors.

Figure 2:
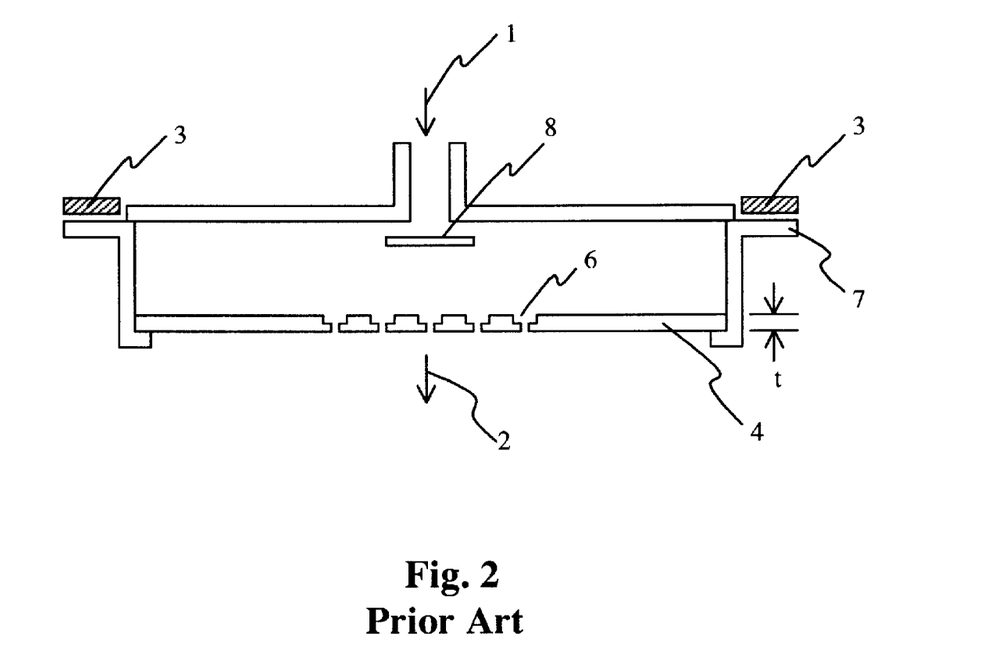
FIG. 2 is a schematic of a prior art showerhead with variable size delivery holes.

FIG. 2 is another prior art schematic diagram of the showerhead. The delivery holes 6 of the showerhead plate have variable diameters, larger diameter facing the precursor inlet and smaller diameter facing the precursor outlet. The showerhead plate 4 is still very thin, and supported by the support structure 7. The variable diameter of the delivery holes further improves the high flow conductance of the showerhead plate 4, but the thermal conductance in this design is much worse due to the high contact resistance between the showerhead plate 4 and the support structure 7.

The prior art showerheads are adequate for many gaseous precursors, but not adequate for liquid precursors, especially at high liquid flow rate. A temperature drop will condense the precursor back into its liquid state, and significant thermal energy is required to convert it back to gaseous state, thus lower the showerhead temperature even more. For liquid precursors, a high thermal conductance showerhead is critical to maintain a constant temperature. High flow conductance is also critial to prevent condensation of the liquid precursors.

It would be advantageous if the showerhead design has high thermal conductance to provide fast thermal energy to the showerhead to prevent liquid precursor from condensation.

It would be advantageous if the showerhead design has high flow conductance to prevent pressure built up inside the showerhead, leading to the condensation of the liquid precursor.

It would be advantageous if the showerhead baffle has high thermal conductance to provide fast thermal energy to the showerhead baffle to prevent liquid precursor from condensation.

It would be advantageous if the showerhead baffle could distribute the precursor more uniformly inside the showerhead.

Accordingly, a high flow conductance and high thermal conductance showerhead plate for a showerhead-type precursor delivery apparatus is provided. The high flow conductance and high thermal conductance showerhead plate comprises:

an array of variable size delivery holes in the showerhead plate, said holes comprising:
a small size portion to permit a desired precursor mixing and pressure difference across said showerhead plate for uniform precursor delivery at every delivery hole;
a larger size portion to maintain high flow conductance across the showerhead plate with different showerhead plate thickness;
a heater means to provide desired temperature to the showerhead plate;
said showerhead plate having sufficient thickness for high thermal conduction from the heater means to maintain the showerhead plate at the desired temperature after the heat loss by supplying to the precursor.

The invention provides a thick showerhead plate (3–50 times thicker than prior art showerhead plate) to improve the thermal conduction. To maintain high flow conductance, the delivery holes have variable size. The smaller portion serves to control the uniform flow at every holes of the showerhead, and the larger portion serves to increase the flow conductance. Accordingly, the heat supplied to the showerhead plate will be constant with respect to the flow of liquid precursor entering the showerhead. The showerhead plate could be made of metal such as stainless steel, aluminum, or anodized aluminum. High thermal conductance metals are desirable materials. One piece showerhead plate is important to maintain the high thermal conductance between the heater means and the showerhead plate. Poor contact resistance such as two-piece construction will lead to low thermal conductance. The metal showerhead also could be used as an electrode in generating a plasma for the reactor.

In some aspects of the invention, the showerhead plate thickness ranges from 3 mm to 20 mm. The high thickness of the showerhead plate will ensure the high thermal conductance between the heater means and the showerhead plate.

In some aspects of the invention, the smaller size portion of the delivery holes is a hollow cylinder with the first diameter between 0.2 mm and 2 mm and first length between 0.5 mm and 5 mm. The smaller size portion of the delivery holes serves to maintain the desired pressure difference across the showerhead plate. Proper pressure difference (order of 1 T) has to be maintained because too low pressure difference will result in non-uniform delivery of the precursor, and high pressure difference will result in condensation of the precursor inside the showerhead. The pressure difference is a function of delivery hole diameter and length.

In some aspects of the invention, the larger size portion of the delivery holes is a hollow cylinder with the second diameter between 2 mm and 15 mm. This larger size portion of the delivery holes maintains the high flow conductance of the thick showerhead. In other aspects of the invention, the larger size portion of the delivery holes has a cone shape with the largest size between 2 mm and 15 mm.

In some aspects of the invention, the larger size portion of the delivery holes is facing the side of the precursor inlet. The precursor exiting the showerhead plate will be more directional. In some aspects of the invention, the larger size portion of the delivery holes is facing the side of the precursor outlet. The precursor exiting the showerhead plate will be more diffusive. In some aspects of the invention, the larger size portion of the delivery holes is at both precursor inlet and outlet sides, sandwiching the smaller size portion. Since the larger size portion also is facing the side of the precursor outlet, the exiting precursor will be more diffusive. This particular aspect of the invention is useful when the showerhead plate is very thick, or when the delivery holes are very close to each other.

In some aspects of the invention, the delivery holes are perpendicular to the showerhead plate plane. The precursor outlet flow will be perpendicular to the showerhead plane, and also to the substrate plane. The precursor will be delivered to an area of the same size as the area of the delivery holes. In other aspects of the invention, the delivery holes are tilted outward for delivering the precursor vapor to a greater area than the area containing the delivery holes. This aspect of the invention is useful when the area to be delivered is larger than the area covered by the delivery holes. In other aspects of the invention, the delivery holes are tilted inward for delivering the precursor vapor to a smaller area than the area containing the delivery holes. This aspect of the invention is useful when the area to be delivered is smaller than the area covered by the delivery holes.

In some aspects of the invention, the heater means is embedded in the showerhead plate. Better heat transfer is achieved using an embedded heater since the thermal conduction is much higher. The showerhead plate needs to be reasonably thick to accommodate the embedded heater.

In some aspects of the invention, the delivery holes having a concentric circles pattern. In other aspects of the invention the delivery holes having a repeated polygonal pattern. The delivery holes are arranged in such a configuration as to provide uniform delivery of the precursor vapor to the substrate. Concentric circles, repeated polygons such as a hexagon, square, or triangle pattern are some examples of the delivery holes pattern.

In some aspects of the invention, a high flow conductance and high thermal conductance showerhead system for a precursor delivery apparatus is provided. The high flow conductance and high thermal conductance showerhead system comprises:

a plurality of precursor inlet ports;
a first high flow conductance and high thermal conductance showerhead plate.

The present invention provides a showerhead system using the high flow conductance and high thermal conductance showerhead plate. The showerhead system comprises a plurality of precursor inlet ports, a showerhead body having the high flow conductance and high thermal conductance showerhead plate. The showerhead plate also comprises precursor outlet ports, or delivery holes, and heater means to maintain the showerhead plate at the desired temperature. The precursor inlet port could be singular or multiple. Typical distribution of the multiple inlet ports is concentric circles or polygon patterns. With 3 inlet ports, the pattern is triangular. With 4 inlet ports, the pattern is square. With 7 inlet ports, the pattern is hexagonal with a center inlet port.

In some aspects of the invention, the showerhead system further included a baffle plate at the precursor inlet ports to diffuse the inlet precursor.

In some aspects of the invention, the showerhead system further including a second high flow conductance and high thermal conductance showerhead plate at the precursor inlet ports to diffuse the inlet precursor. The second high flow conductance and high thermal conductance showerhead plate serves as the showerhead baffle to diffuse the inlet precursor with the added benefit of high thermal conductance.

In some aspects of the invention, the showerhead system with two high flow conductance and high thermal conductance showerhead plates has the area containing the delivery holes of the second high flow conductance and high thermal conductance showerhead plate is smaller than the area containing the delivery holes of the first high flow conductance and high thermal conductance showerhead plate;

the delivery holes of the second high flow conductance and high thermal conductance showerhead plate are tilted outward for delivering the precursor uniformly at a greater area.

The precursor inlet is small, typically from 0.25" to 3" in diameter. The substrate area is typical 8" or 12" in diameter. Therefore a diffuser is needed to diffuse the precursor from the small inlet to the larger area. The second high flow conductance and high thermal conductance showerhead plate having smaller area and tilted delivery holes can serve as the diffuser to improve the uniformity of the precursor delivery at the outlet.

Another aspect of the invention is the method of supplying precursor to the substrate using the high flow conductance and high thermal conductance showerhead plate showerhead. The method comprises the steps of:

a) introducing the precursor to the showerhead;
b) delivering the precursor vapor to the substrate.

In some aspects of the invention a further step precedes Step a), of heating the showerhead to the desired temperature.

In some aspects of the invention a further step after Step b), of applying a power source to generate a plasma between the showerhead and the substrate.

DETAIL DESCRIPTION OF THE PREFERRED EMBODIMENTS

In the following description, for the purposes of explanation and not limitation, specific details are described to provide a thorough understanding of the invention. However, it will be apparent to one skilled in the art that the present invention might be practiced in other embodiments that depart from these specific details.

Figure 3:
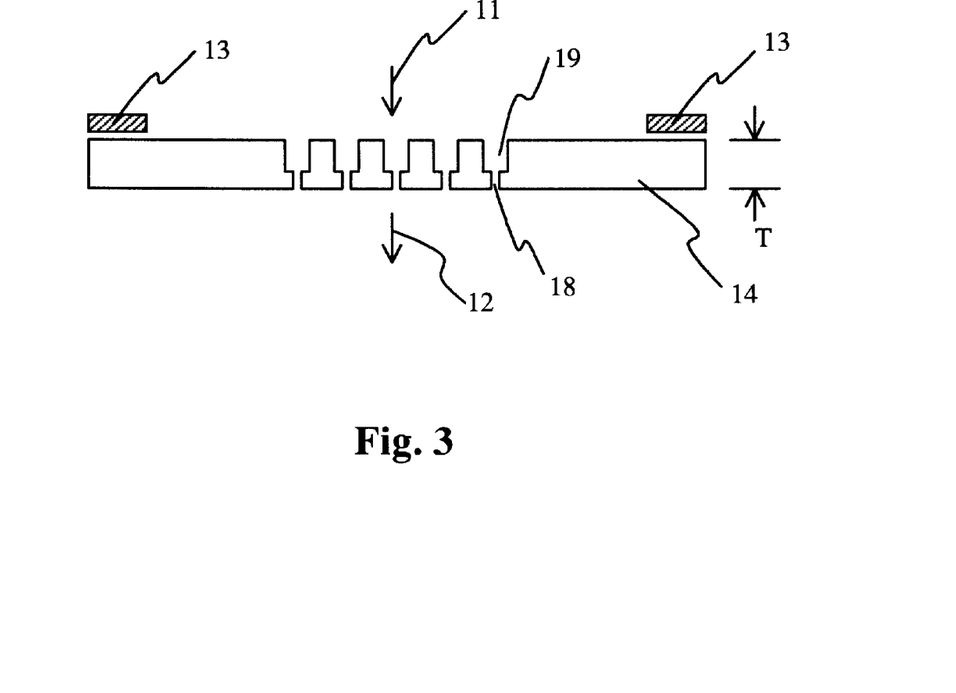
FIG. 3 shows the present invention high flow conductance and high thermal conductance showerhead plate.

FIG. 3 illustrates a high flow conductance and high thermal conductance showerhead plate according to one embodiment of the invention. The showerhead plate is composed of a plate 14 with thickness T having various delivery holes 18. The delivery holes have different sizes, a larger size 19 and a smaller size 18. The plate is heated by the heater means 13. The thickness T between 3 mm and 20 mm is much thicker than prior art showerhead plate, which is typically about 1 mm. This thickness T allows a high thermal conductance from the heater means 13 to the showerhead plate 14. To maintain the high flow conductance across the thick showerhead plate 14, the delivery holes have variable sizes 18 and 19. The smaller size 18, between 0.2 mm and 2 mm in diameter and between 0.5 mm and 5 mm in length, allows the setting of the pressure difference across the showerhead plate. The larger size, between 2 mm and 15 mm in dimension, allows the high flow conductance across the showerhead plate. The precursor flow 11 is introduced into the showerhead plate at the precursor inlet size, pass through the delivery holes 18, and exits to the precursor outlet size 12 onto the substrate. The heater means 13 serves to controllably maintain the showerhead at the desired temperature for efficient operation. Some precursors and their by-products, especially the metal-organic precursors such as copper(hfac)L with L is a ligand such as trimethylvinylsilane, tetrakisdimethylaminetitanium (TDMAT), tetrakisdiethylaminetitanium (TDEAT), pentadiethylaminetantalum (PDMAT), condense at room temperature. Therefore the showerhead is heated above room temperature to prevent condensation. Another purpose of the heated showerhead is to maintain a warm wall environment for desorption of condensable gases that could adversely affect the chemical reaction process.

Figure 4:
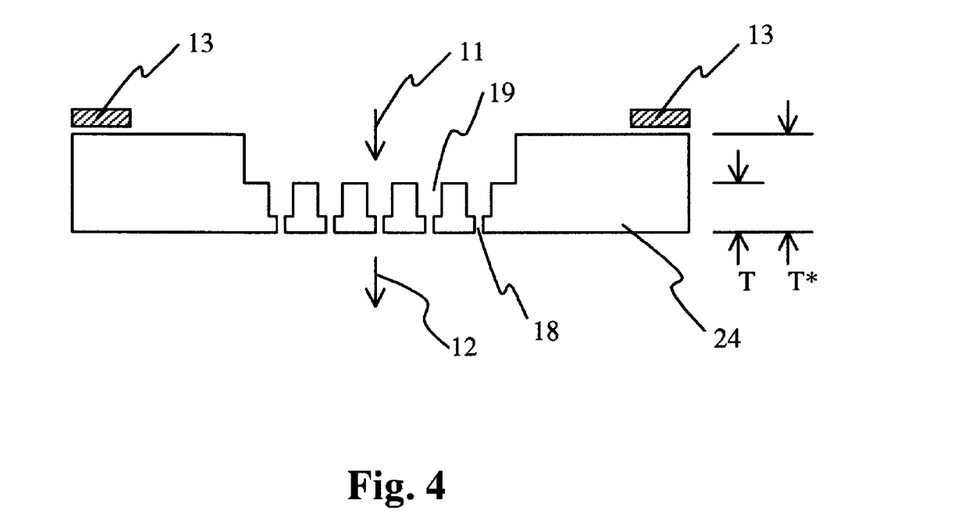
FIG. 4 shows a variation of the present invention high flow conductance and high thermal conductance showerhead plate.

FIG. 4 illustrates a high flow conductance and high thermal conductance showerhead plate 24 according to another embodiment of the invention. The showerhead plate thickness T* outside the area having delivery holes 18 is much thicker than the thickness T inside the area having delivery holes 18. This design allows higher thermal conductance from the heater means 13 while maintain the same high flow conductance across the showerhead plate 24.

Figure 5:
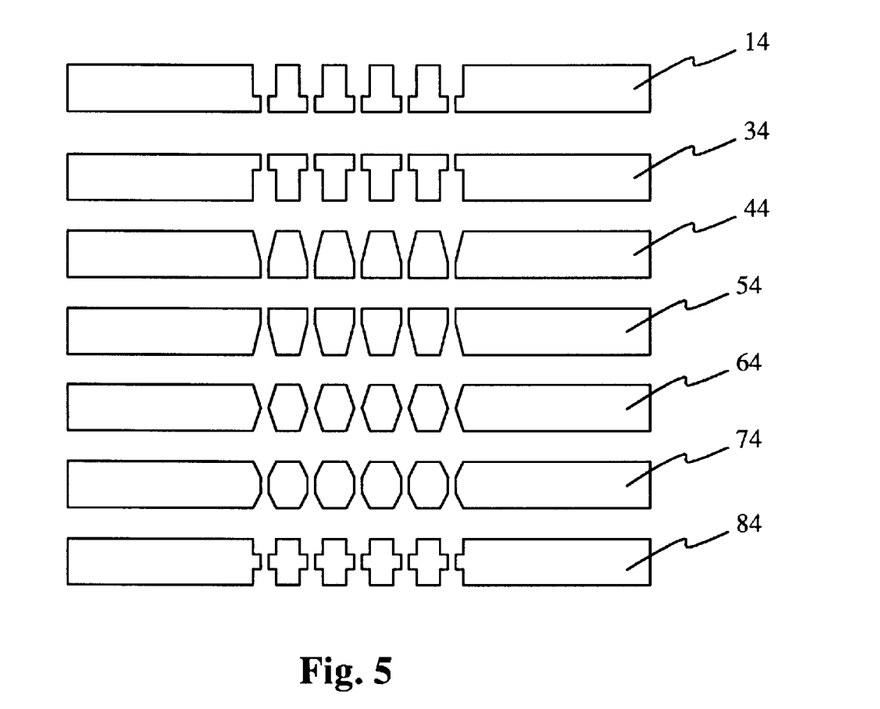
FIG. 5 shows various variations of the high flow conductance and high thermal conductance showerhead plate with different arrangement of larger and smaller delivery holes.

FIG. 5 illustrates various high flow conductance and high thermal conductance showerhead plate 14, 34, 44, 54, 64, 74, and 84. The delivery holes of the showerhead plate 14 and 44 has the larger size portion facing the side of the precursor inlet and the smaller size portion facing the precursor outlet. This design allows a more directional flow of the precursor in the outlet when exiting the showerhead plate. The delivery holes of the showerhead plate 34 and 54 has the smaller size portion facing the side of the precursor inlet and the larger size portion facing the precursor outlet. This design allows a more diffusive flow of the precursor in the outlet when exiting the showerhead plate. The delivery holes of the showerhead plate 64, 74 and 84 has the larger size portion sandwiching the smaller size portion with the larger size portion facing both the precursor inlet and outlet. Similar to 34 and 54 design, this design allows a more diffusive flow of the precursor in the outlet when exiting the showerhead plate.

Figure 6:
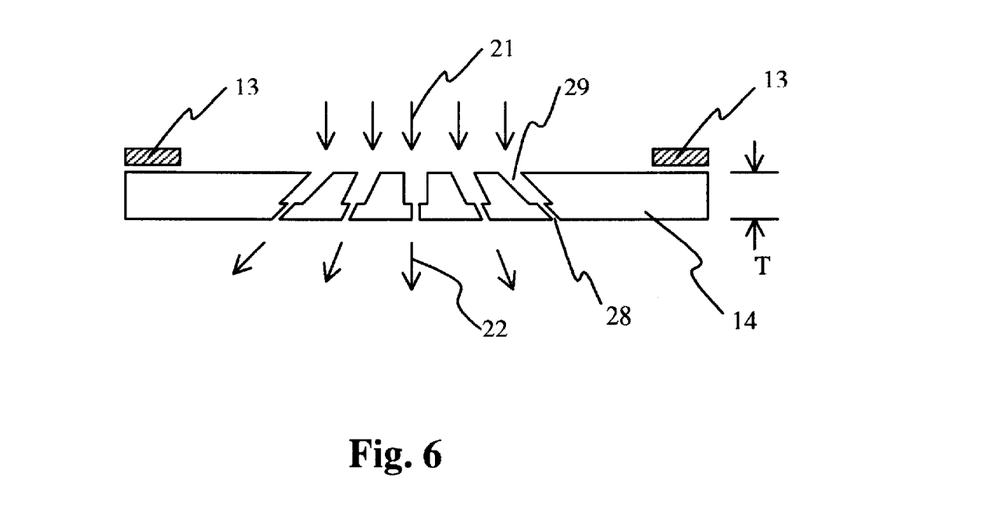
FIG. 6 shows a variation of the high flow conductance and high thermal conductance showerhead with tilted delivery holes.

FIG. 6 illustrates a high flow conductance and high thermal conductance showerhead plate 14 according to another embodiment of the invention. The delivery holes 29 are tilted outward to deliver precursor to an area larger than the area covered by the delivery holes 29. This design allows the distribution of the outlet precursor to be more uniform in a larger area. In the design using perpendicular delivery holes, the area covered by the precursor outlet is the same as the area covered by the delivery holes.

Figure 7:
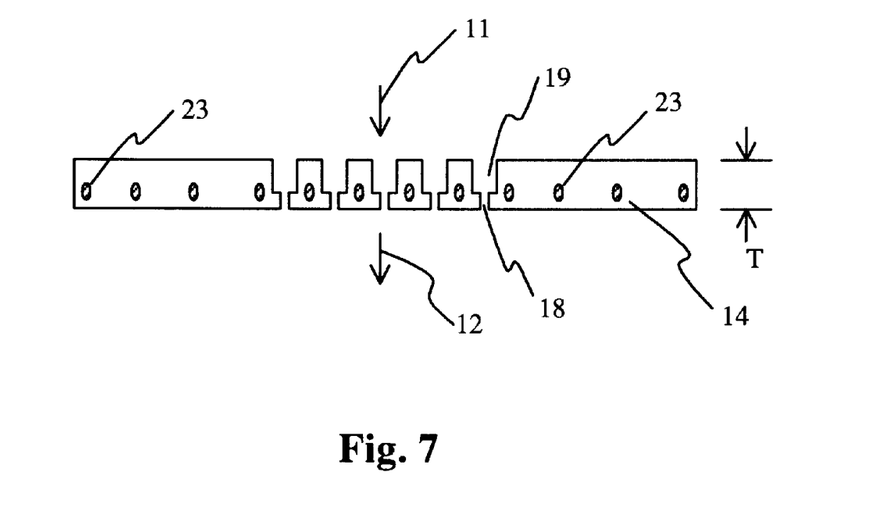
FIG. 7 shows a variation of the high flow conductance and high thermal conductance showerhead with the embedded heater means.

FIG. 7 illustrates a high flow conductance and high thermal conductance showerhead plate 14 according to another embodiment of the invention. The heater means 23 is embedded in the showerhead plate 14. This design allows much higher thermal conductance to the showerhead plate at the expense of fabrication complexity.

Figure 8:
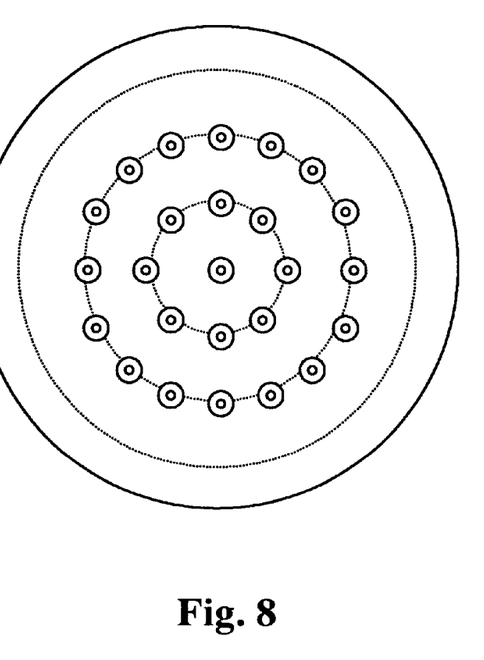
FIG. 8 shows a circular outlet port pattern.

FIG. 8 shows the concentric ring pattern of the outlet ports for the showerhead plate. The smaller portion of the outlet ports diameter ranges from 0.2 mm to 2 mm and the larger portion of the outlet ports diameter ranges from mm to 15 mm. The number of concentric ring ranges from 5 to 40.

Figure 9:
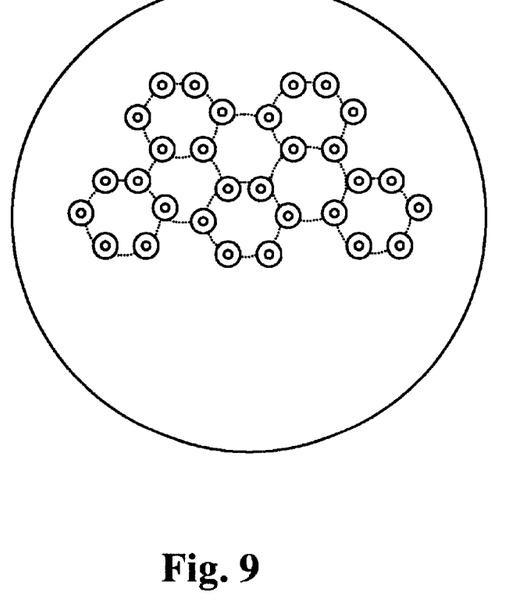
FIG. 9 shows a portion of a repeated hexagonal outlet port pattern.

FIG. 9 shows the hexagonal pattern of the outlet ports. The diameter of the hexagonal ranges from 5 mm to 20 mm.

Figure 10:
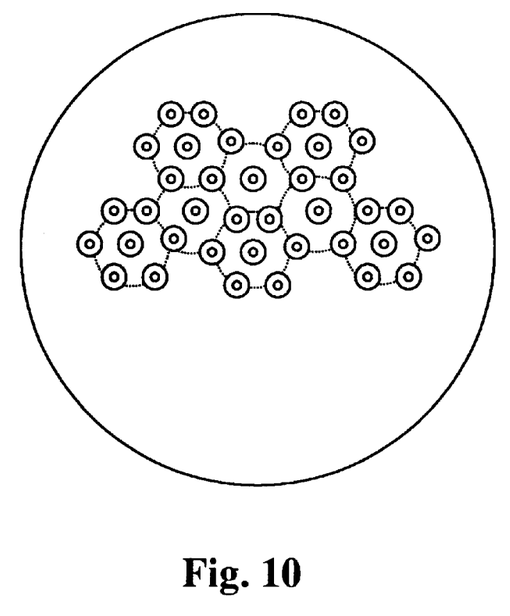
FIG. 10 shows a portion of a repeated triangular outlet port pattern.

FIG. 10 shows the triangular pattern of the outlet ports. The distance between 2 adjacent inlet ports ranges from 2 mm to 15 mm.

Figure 11:
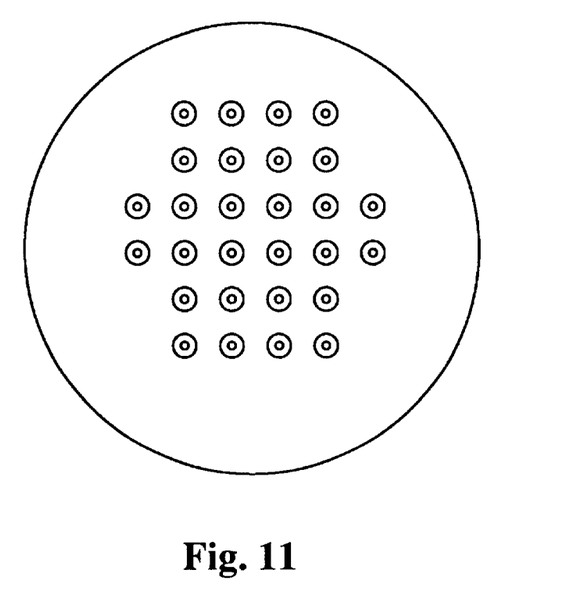
FIG. 11 shows a portion of a repeated square outlet port pattern.

FIG. 11 shows the square pattern of the outlet ports. The distance between 2 adjacent inlet ports ranges from 2 mm to 15 mm.

Figure 12:
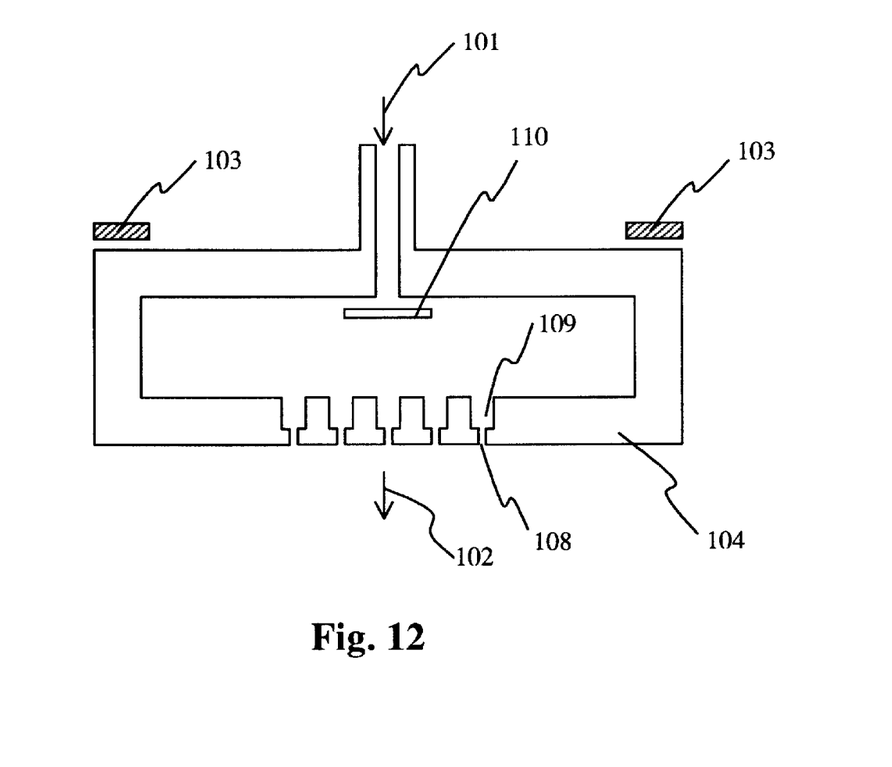
FIG. 12 shows the present invention of the high flow conductance and high thermal conductance showerhead system with a baffle.

FIG. 12 illustrates a high flow conductance and high thermal conductance showerhead system according to one embodiment of the invention. The showerhead system employs a high flow conductance and high thermal conductance showerhead plate 104. The precursor enters the inlet port 101, diffuses through the baffle 110, mixing in the showerhead interior volume, and exits through the showerhead plate 104 by the delivery holes 108 to the substrate below 102. The delivery holes has a larger size portion 109 to maintain high flow conductance and a smaller size portion 108 to maintain the desired pressure difference. The heater means 103 serves to transfer thermal energy to the showerhead plate 104. The showerhead plate 104 has high thermal conductance due to its design to allow efficient heat transfer from the heater means 103.

Figure 13:
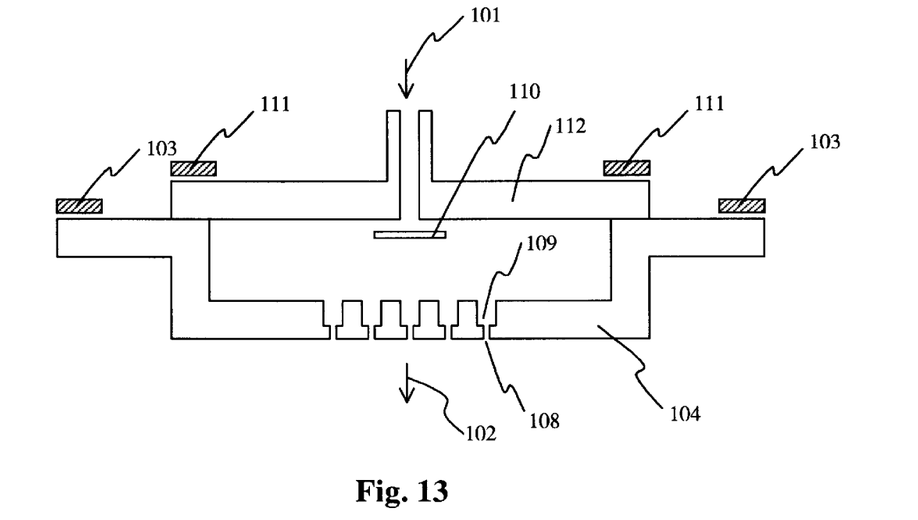
FIG. 13 shows a variation of the high flow conductance and high thermal conductance showerhead system with a baffle.

FIG. 13 illustrates another high flow conductance and high thermal conductance showerhead system according to one embodiment of the invention. The showerhead system employs a high flow conductance and high thermal conductance showerhead plate 104 together with the plate cover 112. The showerhead plate 104 and the plate cover 112 forms the showerhead interior volume for precursor mixing before exiting to the substrate. The plate cover 112 is heated by a second heater means 111.

Figure 14:
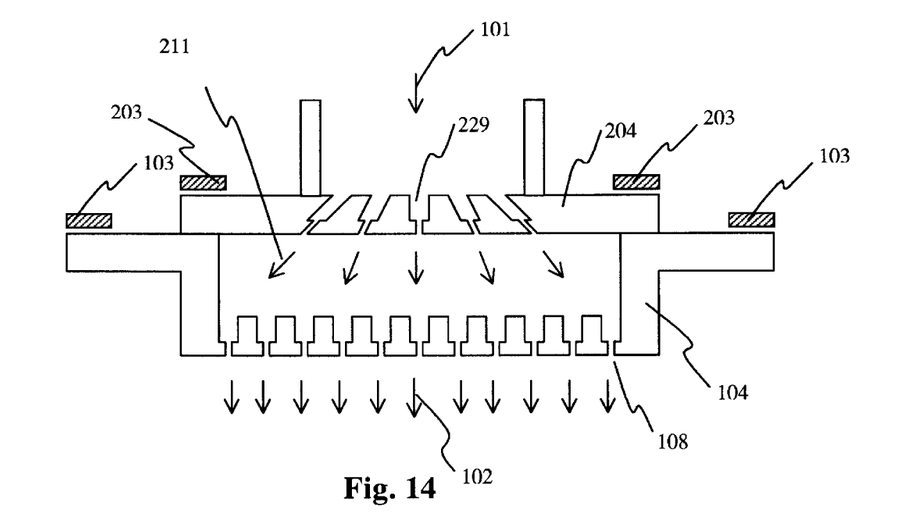
FIG. 14 shows a variation of the high flow conductance and high thermal conductance showerhead system with a second high flow conductance and high thermal conductance showerhead plate acting as a baffle.

FIG. 14 illustrates another high flow conductance and high thermal conductance showerhead system according to one embodiment of the invention. The showerhead system employs two high flow conductance and high thermal conductance showerhead plates 104 and 204. The first showerhead plate 204 serves as a baffle to bring the precursor inlet 101 from a small area to a much larger area 211. The second showerhead plate 104 delivers precursor perpendicular 102 to the substrate. The delivery holes 229 of the first showerhead plate 204 are tilted outward to diffuse the precursor while the delivery holes 108 of the second showerhead plate 104 are perpendicular to deliver the precursor uniformly. Heater means 203 supplies thermal energy to the first showerhead plate 204 and heater means 103 supplies thermal energy to the second showerhead plate 104.

Figure 15:
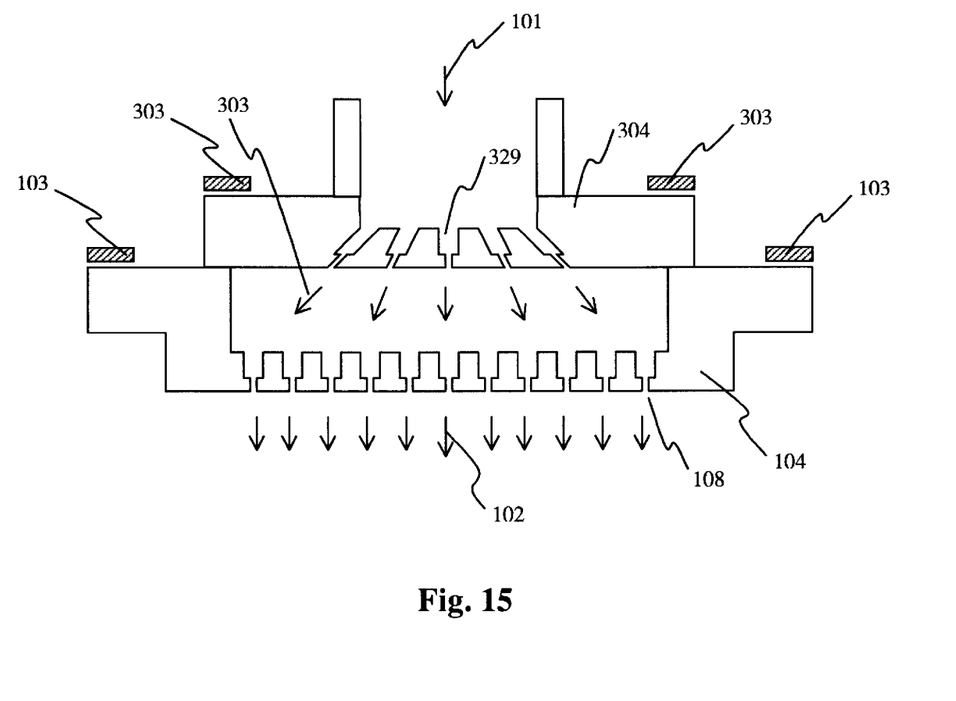
FIG. 15 shows another variation of the high flow conductance and high thermal conductance showerhead system with a second high flow conductance and high thermal conductance showerhead plate acting as a baffle.

FIG. 15 illustrates another high flow conductance and high thermal conductance showerhead system according to one embodiment of the invention. The showerhead system employs two high flow conductance and high thermal conductance showerhead plates 104 and 304. The first showerhead plate 304 has two different thickness, one at the area of the delivery holes and another, thicker, at the edge of the showerhead plate for better thermal conduction.

What is claimed is:

1. A showerhead plate of a showerhead like precursor delivery apparatus, comprising:

a plurality of delivery apertures placed in specified geometric pattern about the showerhead plate, where each delivery aperture is comprised of a large diameter bore to provide improved flow conduction across the showerhead plate and a smaller diameter bore that communicates with the large diameter bore to provide proper mixing of the precursor and a consistent pressure level across the entire showerhead plate to provide a uniform delivery of precursor to each delivery aperture; and a heater means that maintains the showerhead plate at a specified constant temperature, where the heater means supply sufficient thermal energy to the showerhead plate to maintain the specified temperature and compensate for the dissipation of heat caused by the precursor as it moves through the plate, wherein the heater means is embedded in the showerhead plate.

2. A precursor delivery system in accordance with claim 1, wherein the showerhead plate is between 3 mm and 20 mm thick.

3. A precursor delivery system in accordance with claim 1, wherein the smaller diameter bore of the delivery aperture is a hollow cylindrical bore having a diameter between 0.1 mm and 2 mm and a length of between 0.5 mm and 5 mm.

4. A precursor delivery system in accordance with claim 1, wherein the large diameter bore of the delivery aperture is a hollow cylindrical bore having a second diameter of between 2 mm and 15 mm.

5. A precursor delivery system in accordance with claim 1, wherein the large diameter bore of the delivery aperture has a cone shape with the largest size between 2 mm and 15 mm.

6. A precursor delivery system in accordance with claim 1, wherein the delivery apertures are perpendicular to the plane of the showerhead plate.

7. A precursor delivery system in accordance with claim 1, wherein the delivery apertures are tilted outward for delivering the precursor to a greater area than that of the delivery apertures.

8. A precursor delivery system in accordance with claim 1, wherein the delivery apertures of the showerhead plate form a plurality of concentric circles.

9. A precursor delivery system in accordance with claim 1, wherein the delivery apertures of the showerhead plate are placed in the form of plurality repeating polygons.

10. A showerhead system with improved flow conduction and thermal conductance for a precursor delivery apparatus comprising:

a plurality of precursor inlet ports;

a first showerhead plate having improved flow conduction and thermal conductance;

a baffle plate below the precursor inlet ports to diffuse the precursor dispensed from the inlet; and a second showerhead plate with improved flow conduction and thermal conductance at the precursor inlet ports to diffuse the precursor dispensed from the inlet.

11. The showerhead system in accordance with claim 10, wherein an area containing the delivery apertures of the second showerhead plate is smaller than the area containing the delivery apertures of the first showerhead plate, and the delivery apertures of the second showerhead plate are tilted outward for delivering the precursor to a greater area than that of the delivery apertures.

* * * * *